United States Patent [19]

Tanaka

[11] Patent Number: 4,467,225
[45] Date of Patent: Aug. 21, 1984

[54] ADDRESS SELECTION DEVICE

[75] Inventor: Sumio Tanaka, Tokyo, Japan

[73] Assignee: Tokyo Shibaura Denki Kabushiki Kaisha, Kawasaki, Japan

[21] Appl. No.: 183,814

[22] Filed: Sep. 3, 1980

[30] Foreign Application Priority Data

Sep. 10, 1979 [JP] Japan .................. 54-115879

[51] Int. Cl.³ .................... H03K 3/01; H03K 17/687; H03K 19/094
[52] U.S. Cl. ................ 307/296 A; 307/449; 307/571; 307/582
[58] Field of Search ............ 307/571, 582, 592, 270, 307/296 A, 449; 365/227; 364/707

[56] References Cited

U.S. PATENT DOCUMENTS

| | | | |
|---|---|---|---|
| Re. 30,744 | 9/1981 | Cole et al. ................ | 365/227 |
| 3,653,034 | 3/1972 | Regitz ................ | 307/463 |
| 3,825,888 | 7/1974 | Kawagoe ................ | 307/449 |
| 3,980,899 | 9/1976 | Shimada et al. ................ | 307/270 |
| 4,027,174 | 5/1977 | Ogata ................ | 307/270 |
| 4,048,632 | 9/1977 | Spence ................ | 307/296 A |
| 4,096,584 | 6/1978 | Owen et al. ................ | 365/227 |

OTHER PUBLICATIONS

Salsbury, et al., *High Performance MOS EPROMs Using a Stacked-Gate Cell*, 1977 IEEE International Solid-State Circuits Conference, 186–187 (Feb. 18, 1977).

*Primary Examiner*—Stanley D. Miller
*Assistant Examiner*—B. P. Davis
*Attorney, Agent, or Firm*—Finnegan, Henderson, Farabow, Garrett & Dunner

[57] ABSTRACT

An address selection device comprising an address buffer for receiving an address selection signal to produce an output signal which is complementary to the address selection signal; and a decoder circuit for decoding the address selection signal which includes a plurality of MOS transistors connected in parallel with one another and for receiving at their gates corresponding address bit signals of the address selection signal, a MOS transistor as a load resistor connected in series with said plurality of MOS transistors, and a MOS transistor connected between the load resistor MOS transistor and a power source terminal for operating a power source switch and for receiving at the gate a specified bit signal of the complementary signal applied from the address buffer.

4 Claims, 4 Drawing Figures

ADDRESS SELECTION DEVICE

BACKGROUND OF THE INVENTION

The present invention relates to an address selection device for a semiconductor static memory having a reduced power consumption in the decoder circuit.

A decoder circuit in a conventional address selection device used in a semiconductor static memory has a MOS transistor as a power source switch between each decoder unit and a power source terminal. The MOS transistor for the power source switch is so controlled that it is ON only when the decoder circuit is in an active state and is OFF when it is in a stand-by state, thereby saving the power consumed by the device. In this circuit arrangement all the decoder units except the selected one corresponding to a selected word line are fed with current when the device is in operation mode. Therefore, the device in the operation mode consumes as much power as it would were the MOS transistor not provided.

It is therefore desired that the address selection device in the operation mode should consume as little power as possible.

SUMMARY OF THE INVENTION

Accordingly, an object of the present invention is to provide an address selection device with a decoder circuit which consumes but a little power even when set in the operation mode.

To achieve the above object of the invention, there is provided an address selection device comprising: an address buffer means for receiving an address selection signal to produce an output signal which is complementary to the address selection signal; and a decoder circuit means for decoding the address selection signal which includes a plurality of MOS transistors connected in parallel with one another and receiving respectively at their gates corresponding address bit signals of said address selection signal, a load resistor means connected in series with the plurality of MOS transistors, and at least one MOS transistor acting as a power source switch connected between the load resistor means and a power source terminal and receiving at the gate a specified bit signal of the complementary signal applied from the address buffer means.

Other objects and features of the invention will be apparent from the following description taken in connection with accompanying drawings, in which:

DETAILED DESCRIPTION OF THE PREFERRED EMBODIMENTS

Figure 1:
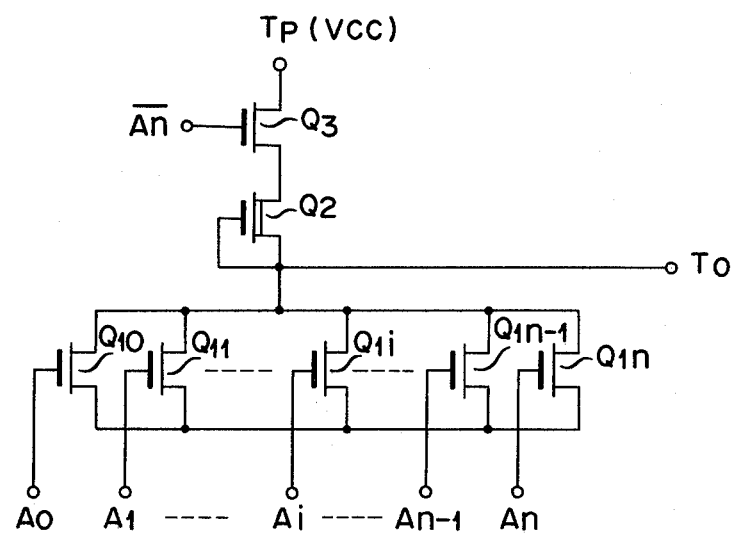
FIG. 1 is a circuit diagram of a decoder circuit of an address selection device according to an embodiment of the present invention.

Referring now to FIG. 1, there is shown a decoder unit of a decoder circuit used in an address selection device according to the present invention. In the figure, a single decoder unit is illustrated for simplicity, although a plurality of the decoder units actually are assembled into the decoder circuit. Driver MOS transistors Q10, Q11, ... Q1i, ..., Q1n connected in parallel with one another are of the enhancement type, with bit signals A0, A1, ... Ai, ..., An being applied to the gates of the transistors per se.

Those driver transistors Q10 to Q1n have commonly connected drains further connected to a depletion type MOS transistor Q2 serving as a load resistor or constant current load means. The gate and source of Q2 are connected to each other to form an output terminal of the decoder unit. The output terminal of the decoder unit is connected to a word line of a poststage memory array (not shown).

An enhancement type MOS transistor Q3 is connected to the drain of the transistor Q2 and a power source terminal $T_p$ impressed with a potential Vcc. The transistor Q3, serving as a power source switch MOS transistor, receives at the gate a signal which is an inversion of any of the bit signals applied to the driver MOS transistors Q10 to Q1n. In FIG. 1, a bit signal $\overline{An}$ is an inversion of a bit signal An applied to the MOS transistor Q1n and is applied to the MOS transistor Q3. The power source switch MOS transistor Q3, which is controlled by the signal $\overline{AN}$, controls the power supply from a power source (not shown) of potential Vcc to the MOS transistors Q10 to Q1n.

In a decoder unit of those decoder units of which the MOS transistor corresponding to the MOS transistor Q1n is supplied with the bit signal of An, the inversion signal $\overline{An}$ is applied to the gate of that MOS power switch transistor, as in the case of the decoder unit illustrated. In the decoder unit having the bit signal $\overline{An}$ inputted, the inversion signal An is inputted to the corresponding power switch transistor.

The operation of the decoder circuit having the decoder units as shown in FIG. 1 will be described.

Assume now that the bit signals A0, A1, ..., An applied to the gates of the MOS transistor Q10 to Q1n are at low level and thus the signal applied to the gate of the power source switch MOS transistor Q3 is at high level. In this case, the MOS transistors Q10 to Q1n are all OFF whereas the power source switch Q3 is ON. Under this condition, the power source of Vcc supplies power to the MOS transistors Q10 to Q1n. As a result, the potential level at the output terminal T0 of the decoder unit is high and the signal level on a word line (not shown) connected to the output terminal T0 is high to select the word line.

In case where the address bit signals at low level as address bit signals are inputted to the decoder unit including the driver transistors Q10 to Q1n, the address selection signals inputted to the remaining decoder units (not shown) of the decoder circuit includes at least one high level bit signal. Accordingly, the drive MOS transistors with the high level bit signals of those remaining decoder units are ON with the output terminals having signals at low level. In this condition, the word lines connected to the decoder units are in non-selection state. The above is the operation shown in the MOS decoder circuit.

The MOS decoder circuit shown in FIG. 1 contributes to the power saving of the device. This will be seen when reading the operation to be given below. As described above, the FIG. 1 embodiment uses an inverted one of the bit signals applied to the driver MOS transistors of the decoder unit for a signal for controlling the power source switch transistor in each decoder unit, and uses as a bit signal a specified bit signal common for all the decoder units. Therefore, in the decoder circuit of the full-decoding type, half of the decoder units thereof have a situation that a low level signal is applied to the gates of the power source switch transistors. This implies that even in the operation mode, the power source switch transistors of the half of the decoder units are OFF, and therefore the decoder units to which current flows are only half number of all the decoder units. In other words, the power consumption of the present embodiment is reduced half, compared to the conventional one.

As described above, in the decoder circuit shown in FIG. 1, the power source switch transistor Q3 is controlled by the level-inverted signal applied to the gate of the driver transistor Q1n. In order to block the power supply in the stand-by state, it is necessary to render low in level both the signals applied to the gate of the transistors Q1n and Q3. In order to prevent the output terminal of the decoder unit shown in FIG. 1 from being in a floating state, it is preferable to render low in level the signals inputted to all the drive transistors other than the drive transistor Q1n. An example of the address buffer circuit for producing such signals is shown in FIG. 2.

Figure 2:
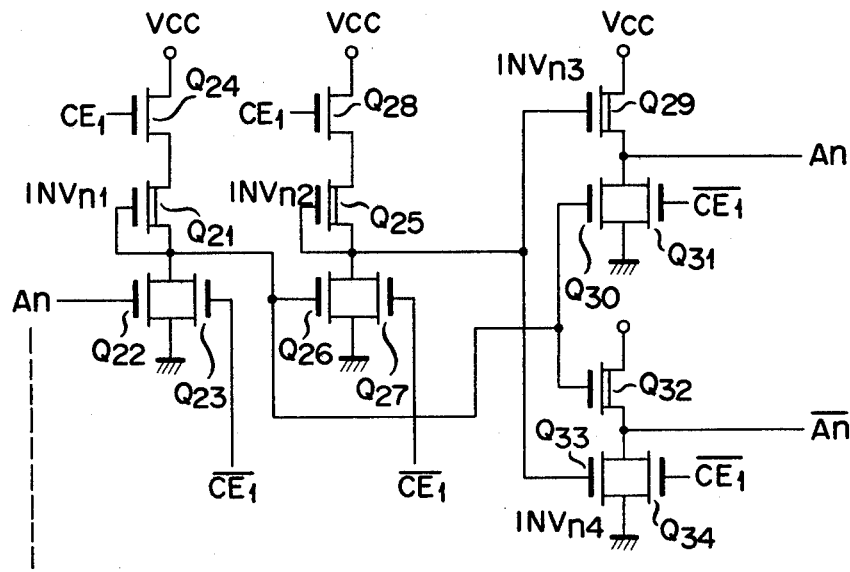
FIG. 2 is a circuit diagram of an address buffer circuit used in the address selection device of the present invention.
Figure 2:
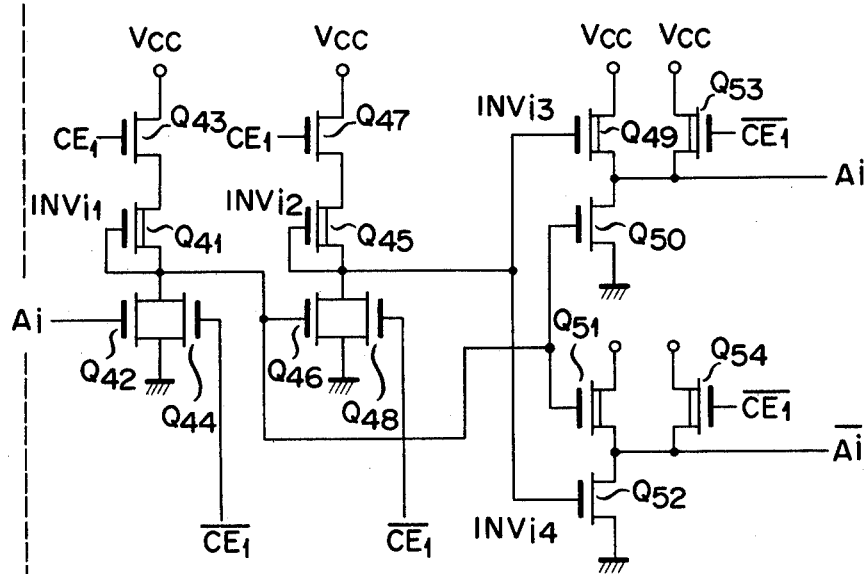

In FIG. 2, there are illustrated an address buffer unit BUn for producing signals to be applied to the gate of the power source switch transistor Q3 and an address buffer unit BUi for producing signals to be applied to the gate of the drive MOS transistor, for example, Q1i, other than the transistor Q1n.

The construction of the address buffer unit BUn will first be given. MOS transistors Q21 and Q22 form an inverter INVn1. The transistor Q22 is connected in parallel with a MOS transistor Q23. Between the transistor Q21 and a positive terminal Vcc is connected a MOS transistor Q24 as a power source switch.

MOS transistors Q25 and Q26 form an inverter INVn2. A transistor Q27 is connected in parallel with the transistor Q26. A MOS transistor Q28 as a power source switch is connected between the transistor Q25 and the positive potential Vcc. MOS transistors Q29 and Q30 form a push-pull inverter INVn3. The drain of the MOS transistor Q29 is connected to the positive potential Vcc. The transistor Q30 is connected in parallel with a MOS transistor Q31. MOS transistors Q32 and Q33 form a push-pull inverter INVn4. The drain of the transistor Q32 is connected to the positive potential Vcc. The transistor Q33 is connected in parallel to the MOS transistor Q34.

The MOS transistors Q22, Q23, Q26, Q27, Q30, Q31, Q33 and Q34 are connected at the sources to ground. The transistors Q26, Q30 and Q32 are connected at the gates to the output terminal of the inverter INVn1 including the transistors Q21 and Q22. The output terminal of the inverter INVn2 including the transistors Q25 and Q26 is connected to the gates of the transistors Q29 and Q33. A chip enable signal CE1 is inputted to the gates of the transistors Q24 and Q28. A signal $\overline{CE1}$ as an inversion of a signal CE1 is applied to the gates of the transistors Q23, Q27, Q31 and Q34. The MOS transistors Q21, Q25, Q29 and Q32 are of the depletion type, while the MOS transistors Q22, Q23, Q24, Q26, Q27, Q28, Q30, Q31, Q33 and Q34 are of the enhancement type. The address buffer unit applying signals to the gates of the drive transistor Q1n and the power source switch transistor Q3 is constructed as mentioned above.

The explanation to follow is the elaboration of the address buffer unit BUi for applying signals to the input drive transistor Q1i and the signal impression.

As shown, an inverter INVi1 constructed by MOS transistors Q41 and Q42 is connected to a positive potential Vcc through a MOS transistor Q43 serving as a power source switch. The MOS transistor Q42 is connected in parallel with a MOS transistor Q44. An inverter INVi2 including MOS transistors Q45 and Q46 is connected to a positive potential Vcc through a MOS transistor Q47 as a power source switch. A MOS transistor Q48 is connected in parallel with the transistor Q46. The MOS transistors Q49 and Q50 form a push-pull inverter INVi3. The drain of the transistor Q49 is connected to the positive potential Vcc. MOS transistor Q51 and Q52 form a push-pull inverter INVi4 and the drain of the transistor Q51 is connected to a positive potential Vcc. A MOS transistor Q53 is connected between the output terminal of the inverter INVi3 including the transistors Q49 and Q50 and the positive potential Vcc. Similarly, a MOS transistor Q54 is connected between the output terminal of the inverter INVi4 including the transistors Q51 and Q52 and the positive potential Vcc. The sources of the transistors Q42, Q44, Q46, Q48, Q50 and Q52 are connected to ground. The gates of the transistors Q46, Q50 and Q51 are connected to the output terminal of the inverter INVi1 including the transistors Q41 and Q42. The gates of the transistors Q49 and Q52 are connected to the output terminal of the inverter INVi2 including the transistors Q45 and Q46. A chip enable signal CE1 is applied to the gates of the transistors 43 and 47, while the inverted signal $\overline{CE1}$ is applied to the gates of the transistors Q44, Q48, Q53 and Q54.

The MOS transistors Q41, Q45, Q49, Q51, Q53 and Q54 are of the depletion type while the MOS transistors Q42, Q43, Q44, Q46, Q47, Q48, Q50 and Q52 are of the enhancement type.

The operation of the address buffer circuit as shown in FIG. 2 when it is driven, will be described.

The operation of an address buffer means BUn follows.

When it is driven, the signal CE1 is at high level and thus the transistors Q24 and Q28 are ON. Further, at this time the bit signal An is at high level and therefore the transistor Q22 is also ON. Under this condition, the output signal from the inverter INVn1 is at high level. Accordingly, the transistors Q26 and Q30 are OFF, and the transistor Q32 is in a low conductance state.

At this time, the signal $\overline{CE1}$ is at low level, so that the transistor Q27 is OFF. Therefore, the output level of the inverter INVn2 is high and the transistors Q29 and Q33 are both ON. Thus, the transistor Q29 is ON while the transistor Q30 is OFF. Accordingly, the output level of the inverter INVn3 is high in level. The output level of the inverter INVn3 is a signal An with the same level as that of the input level.

Since the transistor Q32 is OFF and the transistor Q33 is in a low conductance state, the output level of the inverter INVn4 is low. Thus, the output signal from the inverter INVn4 is the inverted signal $\overline{An}$ of the input bit signal.

Through the above-mentioned operation, there are produced the signals An and $\overline{An}$ with different levels.

The operation as mentioned above by using a case where the input bit signal An is high in level, is correspondingly applied for a case where it is low. In this case, the output level is inverted, so that two output signals are exchanged with each other in level such that the output level of the inverter INVn3 is at low level and the output level of the inverter INVn4 is high in level.

The operation of the address buffer unit BUi will be described.

Assume that the input bit signal is high in level. When it is in the drive mode, the signal CE1 is high in level, so that the transistors Q43 and Q47 are ON. Further, the bit signal Ai is high in level, the transistor Q42 also is ON. Accordingly, the output signal of the inverter INVi1 becomes low in level. The result is that the transistors Q46 and Q50 are OFF and the transistor Q51 is in a low conductance state.

In the drive mode of the address buffer circuit, the signal CE1 is low, so that the transistor Q48 is OFF to cause the output signal of the inverter INVi2 to be high in level. Accordingly, the transistors Q49 and Q52 are both ON. Thus, the transistor Q49 is turned ON while the transistor Q50 is OFF, with the result that the output level of the inverter INVi3 is high, Thus, the output level of the inverter INVi3 is the same as that of the input bit signal Ai. The situation that the transistor Q51 is in a low conductance state OFF and the transistor Q52 is ON renders low the output level of the inverter INVi4. The level of the output signal from the inverter INVi4 is $\overline{Ai}$ which is an inversion of the input bit signal Ai.

Through the operations as mentioned above, there are obtained the output signals of and $\overline{Ai}$ with different levels.

The operation when the input bit signal An is high in level is correspondingly applicable for that when the input bit signal An is low. In this case, the output signal level is inverted to exchange the levels of the two output signals such that the output level of the inverter INVi3 is low and that of the inverter INVi4 is high.

The operation of the device in the stand-by mode will be described. In this case, the bit signals An and Ai are both not applied to the device. Accordingly, the input levels to the gates of the transistors Q22 and Q42 are both low.

The operation in the case of the address buffer unit BUn will first be given.

In the stand-by mode, the signal CE1 is high and thus the transistors Q23, Q27, Q31 and Q32 are ON. Since the signal CE1 is low, the transistors Q24 and Q28 are OFF, so that the signal levels from the inverters INVn1 and INVn2 are both low. Accordingly, the transistor Q33 is OFF and the transistor Q29 is in a low conductance state. As previously stated, since the transistors Q31 and Q34 are ON, the output signals of the inverters INVn3 and INVn4 are both low in level.

The operation of the address buffer means BUi in the stand-by mode will be given.

In the stand-by mode, the signal CE1 is low and the signal CE1 is high, as mentioned above. Accordingly, the transistors Q43 and Q47 are OFF and the transistors Q44, Q46, Q53 and Q54 are ON. As a result, the output level of the inverters INVi1 and INVi2 is low. This causes the transistors Q50 and Q52 to be low in level and the transistors Q49 and Q51 to be low in conductance. Accordingly, the outputs of the inverters INVi3 and INVi4 become high since the transistors Q53 and Q54 are ON.

As described above, in the stand-by mode, the signals outputted from the address buffer unit BUn are low while the output signals from the address buffer unit BUi are high.

Therefore, by using the address buffer circuit as shown in FIG. 2, signals required by the decoder circuit shown in FIG. 1 may be produced.

Figure 3:
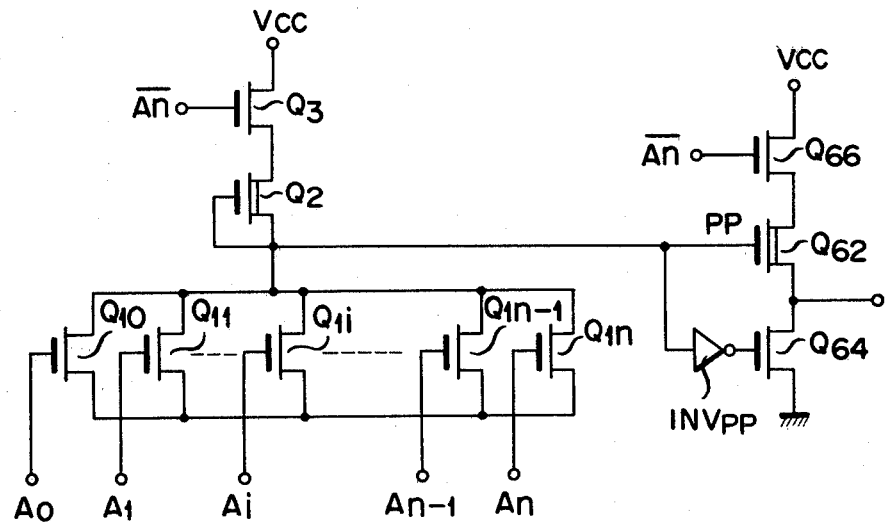
FIG. 3 is a circuit diagram of another decoder circuit of the present invention.

FIG. 3 is another embodiment of the decoder unit in the address selection device according to the present invention. This embodiment is well adaptable for a case where a large capacitive load is connected to the output terminal. The embodiment is featured by a push-pull circuit at the output portion for maintaining a high speed operation. Like numerals are used to designate like portions in FIG. 1.

As just mentioned, a push-pull circuit PP is connected to the output portion of the decoder unit shown in FIG. 1. As shown, the push-pull circuit is comprised of a depletion type MOS transistor Q62 and an enhancement type transistor Q64, both being connected in series, and an inverter INVpp connected between the drains of the drive transistors Q10, Q11, Q12, ..., Q1n and the gate of the transistor Q64. The push-pull circuit PP is provided to hold a high speed operation of the decoder circuit even when a large capacitive load is connected to the output side of the decoder circuit. It operates such that the transistors Q62 and Q64 are alternately ON and OFF every time the level of the input signal is inverted. When the level of the drains of the drive MOS transistors Q10, Q11, ... Q1i, ..., Q1n are high, for example, the transistor Q62 is turned ON while the transistor Q64 is turned OFF. On the other hand, when the level of the drains of the MOS transistors Q10, Q11, ... Q1i, ..., Q1n are low, the transistor Q64 is ON while the transistor Q62 is in a low conductance state.

In the push-pull circuit PP, a MOS transistor Q66 as a power source switch like the MOS transistor Q3 is provided between the push-pull circuit PP and the positive potential. To the gate of the MOS transistor Q66 is applied a signal $\overline{An}$ for the transistor Q3. Provision of the power source switch MOS transistor between the push-pull circuit PP and the positive potential Vcc, which is controlled by the signal $\overline{An}$, remarkably reduces power consumption by the push-pull circuits of the decoder units not selected, for the reason as described referring to the transistor Q3.

Figure 4:
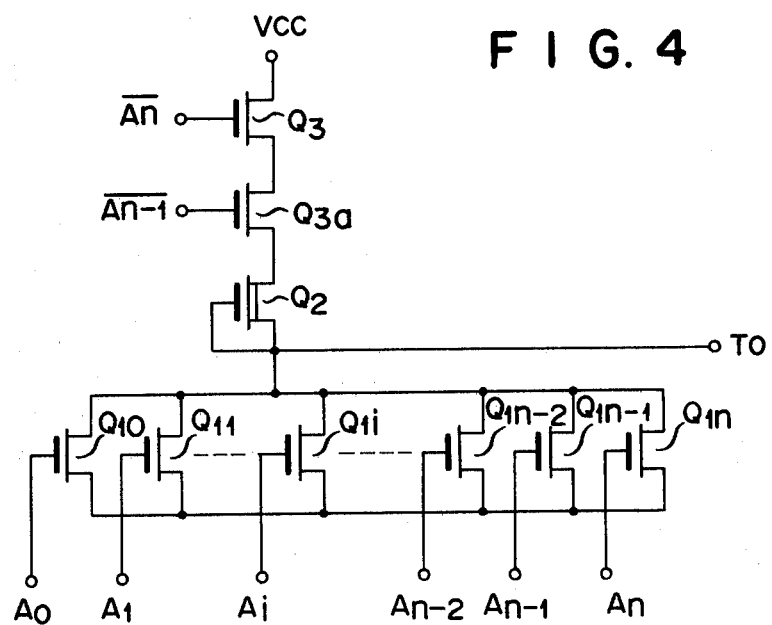
FIG. 4 is a circuit diagram of yet another decoder circuit of the present invention.

Another embodiment of the decoder circuit is illustrated in FIG. 4. Also in FIG. 4, like numerals are used for designating like portions in FIG. 1. In this embodiment, a load resistor Q3a is connected in series to the load resistor Q3 in the decoder circuit shown in FIG. 1. The signal $\overline{An}$ is applied to the transistor Q3, as in the embodiment of FIG. 1. A signal An-1 is applied to the transistor Q3a. The signals $\overline{An}$ and An-1 are applied to the gates of the transistors corresponding to those Q3 and Q3a in the decoder units not shown wherein the bit signals An and An-1 are inputted. On the other hand, the signals An and An-1 are applied to the gates of the transistors corresponding to those Q3 and Q3a in those decoder units wherein the bit signals $\overline{An}$ and An-1 are applied. In such a circuit construction, in the decoder circuit of the full-decoding type, the decoder units in which the signals $\overline{An}$ and An-1 are both high in level are ¼ of those not selected. In the remaining ¾ decoder units, at least either of the $\overline{An}$ and An-1 is low. Therefore, no current flows into the remaining ones to remarkably save the power consumption.

The embodiment shown in FIG. 4 is the decoder unit with two load resistors connected in series. The number of the load resistors connected in series is not limited to two.

As described above, the address selection device of the invention employs the inverted bit signal applied to the gate of the drive MOS transistor as the control signal to the load resistor MOS transistor in each decoder unit. For this reason, only half or less number of decoder units of those decoder units not selected allows current to flow thereinto. The power consumption of the address selection device is remarkably reduced.

What is claimed is:

1. An address selection device having a power source terminal and being coupled to a multi-bit signal address selection signal, said device comprising:
   (a) address buffer means for receiving said address selection signal and producing output bit signals which are complementary to bit signals of said address selection signal; and
   (b) decoder circuit means for decoding said address selection signal which includes a plurality of MOS transistors connected in parallel with one another and receiving respectively at their gates corresponding bit signals of said address selection signal, constant current load means connected in series with said plurality of parallel-connected MOS transistors, and a plurality of MOS transistors being connected in series between said load means and said power source terminal, each of said plurality of series-connected MOS transistors receiving at its individual gate a different specified one of said complementary bit signals from said address buffer means.

2. An address selection device having a power source terminal and being coupled to a multi-bit signal address selection signal, said device comprising:
   (a) address buffer means for receiving said address selection signal and producing output bit signals which are complementary to bit signals of said address selection signal; and
   (b) decoder circuit means for decoding said address selection signal which includes a plurality of MOS transistors connected in parallel with one another and receiving respectively at their gates corresponding bit signals of said address selection signal, constant current load means connected in series with said plurality of parallel-connected MOS transistors, an MOS transistor power source switch connected between said load means and said power source terminal and receiving at its gate a specified complementary bit signal from said address buffer means, an output stage push-pull circuit comprising first and second MOS transistors connected in series to each other and an inverter connected between the gates of said first and second MOS transistors, and a third MOS transistor connected between said push-pull circuit and said power source terminal for operating as a power source switch.

3. An address selection device according to claim 1 wherein said constant current load means is a diode-connected MOS transistor.

4. An address selection device according to claim 2 wherein said constant current load means is a diode-connected MOS transistor.

* * * * *